(12) United States Patent
Messier

(10) Patent No.: US 7,523,238 B2
(45) Date of Patent: Apr. 21, 2009

(54) DEVICE AND METHOD TO REDUCE SIMULTANEOUS SWITCHING NOISE

(75) Inventor: Jason Messier, Boston, MA (US)

(73) Assignee: Teradyne, Inc., North Reading, MA (US)

( * ) Notice: Subject to any disclaimer, the term of this patent is extended or adjusted under 35 U.S.C. 154(b) by 485 days.

(21) Appl. No.: 11/170,857

(22) Filed: Jun. 30, 2005

(65) Prior Publication Data

US 2007/0005282 A1   Jan. 4, 2007

(51) Int. Cl.
*G06F 13/42* (2006.01)
*H03M 1/00* (2006.01)

(52) U.S. Cl. ........................ 710/105; 341/123

(58) Field of Classification Search ........... 710/105; 341/173, 123
See application file for complete search history.

(56) References Cited

U.S. PATENT DOCUMENTS

| | | | | |
|---|---|---|---|---|
| 5,477,460 | A | 12/1995 | Vakirtzis et al. | 364/489 |
| 5,931,927 | A | 8/1999 | Takashima | |
| 6,662,352 | B2 | 12/2003 | Nsame et al. | 716/14 |
| 6,763,406 | B1 * | 7/2004 | Devanney et al. | 710/65 |
| 6,774,836 | B2 | 8/2004 | Frech et al. | 341/173 |
| 7,043,670 | B2 * | 5/2006 | Alani et al. | 714/47 |
| 7,139,691 | B1 * | 11/2006 | Duong | 703/19 |
| 7,176,713 | B2 * | 2/2007 | Madurawe | 326/38 |
| 2003/0011500 | A1 | 1/2003 | Takeuchi et al. | |
| 2004/0066213 | A1 | 4/2004 | Kwak et al. | |
| 2005/0132112 | A1 * | 6/2005 | Pawlowski | 710/110 |
| 2005/0188282 | A1 * | 8/2005 | Joshi | 714/43 |

OTHER PUBLICATIONS

International Search Report (PCT/US06/25245); Date of Mailing: Feb. 13, 2008; 1 page.

* cited by examiner

*Primary Examiner*—Khanh Dang
*Assistant Examiner*—Christopher A Daley
(74) *Attorney, Agent, or Firm*—Foley & Lardner LLP; Joseph M. Maraia; Ralph Trementozzi

(57) ABSTRACT

By reducing a cumulative number of drivers changing values during a transition, the cumulative current change may be reduced, along with the simultaneous switching noise effects. Also, a reduced cumulative current change can also reduce voltage fluctuations in ground and/or power planes of a chip, thereby minimizing potential improper logic functions due to voltage dips or spikes. In one implementation, the method includes reading values of a first state of a first set of bits of a first word and obtaining a projected value of a second state of each of the first set of bits. If the first switching noise cumulative effect can be reduced by changing the projected values of the second state of the first set of bits, an alternate set of values having at least one value differing from the projected values of the second state is determined to reduce the first switching noise cumulative effect.

6 Claims, 3 Drawing Sheets

DEVICE AND METHOD TO REDUCE SIMULTANEOUS SWITCHING NOISE

BACKGROUND

Simultaneous switching noise (SSN) is one form of noise that can exist in electronic systems. SSN can be caused by a substantial number of drivers switching in the same direction within a short time window. Effects of a substantial number of such switching can include dips or spikes in the voltage supply to the chip and can propagate as noise through both active and inactive drivers.

In extreme cases, SSN can prevent proper functioning of the electronic system. For example, disruption to voltage levels of power and/or ground planes in a chip can prevent logic circuitry from functioning correctly. If a logic 1 output from a gate array is lower than the minimum allowable logic 1 at an inverter, the logic 1 output may not be correctly interpreted by the inverter. Likewise, a logic 0 from the gate array above the maximum allowable logic 0 at the inverter could result in an improper or indeterminate result.

Traditionally, attempts to address SSN have involved physically spreading drivers/pins, differential signaling, skewing the timing between groups of drivers, and/or adding resistors to the circuitry. However, these may be detrimental to performance, cost, design margin, and/or complexity from a packaging perspective.

SUMMARY

The present invention is directed toward addressing simultaneous switching noise (SSN) by seeking to reduce net transition energy of simultaneously switching drivers. Various embodiments of the present invention provide methods involving an encoding protocol to reduce the number of proximally-located drivers changing values during a transition from a first state to a second state. By reducing the cumulative number of value changes during a transition, the cumulative current change may be reduced, along with the simultaneous switching noise effects. Also, a reduced cumulative current change can also reduce voltage fluctuations in ground and/or power planes of a chip, thereby minimizing potential improper logic functions due to voltage dips or spikes.

According to one embodiment of the invention, a method for reducing simultaneous switching noise is provided. The method includes reading values of a first state of a first set of bits of a first word and obtaining a projected value of a second state of each of the first set of bits. A first switching noise cumulative effect of a transition of each of first set of bits from the first state to the second state is determined, and if the first switching noise cumulative effect can be reduced by changing the projected values of the second state of the first set of bits, an alternate set of values having at least one value differing from the projected values of the second state is determined to reduce the first switching noise cumulative effect. The alternate set of values is written to the first set of bits as the second state, and setting a first designator in at least one bit of the first word.

According to another embodiment, a bus protocol to reduce transient noise is provided. The method includes reading values of a first state of a first set of bits of a first word and obtaining a projected value of a second state of each of the first set of bits. A first switching noise cumulative effect of a transition of each of first set of bits from the first state to the second state is determined. If the first switching noise cumulative effect can be reduced by changing the projected values of the second state of the first set of bits, an alternate set of values is determined, having at least one value differing from the projected values of the second state to reduce the first switching noise cumulative effect. The alternate set of values is written to the first set of bits as the second state, and a designator is set in at least one bit of the first word. Also according to the method, the bus protocol includes reading the designator in at least one bit of the first word. If the designator is set, the alternate set of values is read from the first set of bits and determining the projected values of the second state of the first set of bits from the alternate set of values. Alternatively, if the designator is not set, the values of the first set of bits is read as the second state of the first set of bits. According to another embodiment, a computer readable medium to reduce transient noise in a digital circuit system is provided. The computer readable medium has code for performing the method described above.

Another embodiment of the invention provides a method for reducing transition energy. According to the method, a score representative of at least a plurality of binary transitions is determined. Each binary transition is from a first state to a corresponding second state. If the score indicates that more than half of the first states of the plurality of binary transitions differ from the corresponding second states, the values of the second states are inverted and a designator is set. The second states are written to a plurality of bits corresponding to the plurality of binary transitions. If the designator is set, the designator is written to a bit associated with the plurality of bits corresponding to the plurality of binary transitions.

A further embodiment of the invention provides a device to reduce transient noise in a digital circuit system. The device includes means for determining a score representative of at least a plurality of binary transitions, each binary transition from a first state to a corresponding second state and means for inverting the values of the second states if the score indicates that more than half of the first states of the plurality of binary transitions differ from the corresponding second states. Means are also provided for setting a designator if the score indicates that more than half of the first states of the plurality of binary transitions differ from the corresponding second states.

Another embodiment of the invention provides a method for reducing simultaneous switching noise. The method includes reading values of a first state of a first set of bits of a first word and obtaining a first projected value of a second state of each of the first set of bits. A first alternate set of values is determined, wherein the first alternate set of values have at least one value differing from the first projected values of the second state to reduce a first switching noise cumulative effect. The method also includes writing the first alternate set of values to the first set of bits as the second state. This method can also optionally include reading the first alternate set of values from the first set of bits and determining the projected value of a second state of each of the first set of bits from the first alternate set of values. According to another embodiment, a computer readable medium to reduce transient noise in a digital circuit system is provided by way of code for performing the method described above.

BRIEF DESCRIPTION OF THE DRAWINGS

The invention will be apparent from the description herein and the accompanying drawings, in which like reference characters refer to the same parts throughout the different views.

DETAILED DESCRIPTION

Various embodiments of the present invention address simultaneous switching noise by seeking to reduce the number of proximally-located drivers changing values during a transition from a first state to a second state. By reducing the cumulative number of value changes during a transition, the cumulative current change may be reduced, along with the simultaneous switching noise effects. Also, a reduced cumulative current change can also reduce voltage fluctuations in ground and/or power planes of a chip, thereby minimizing potential improper logic functions due to voltage dips or spikes.

Figure 1:
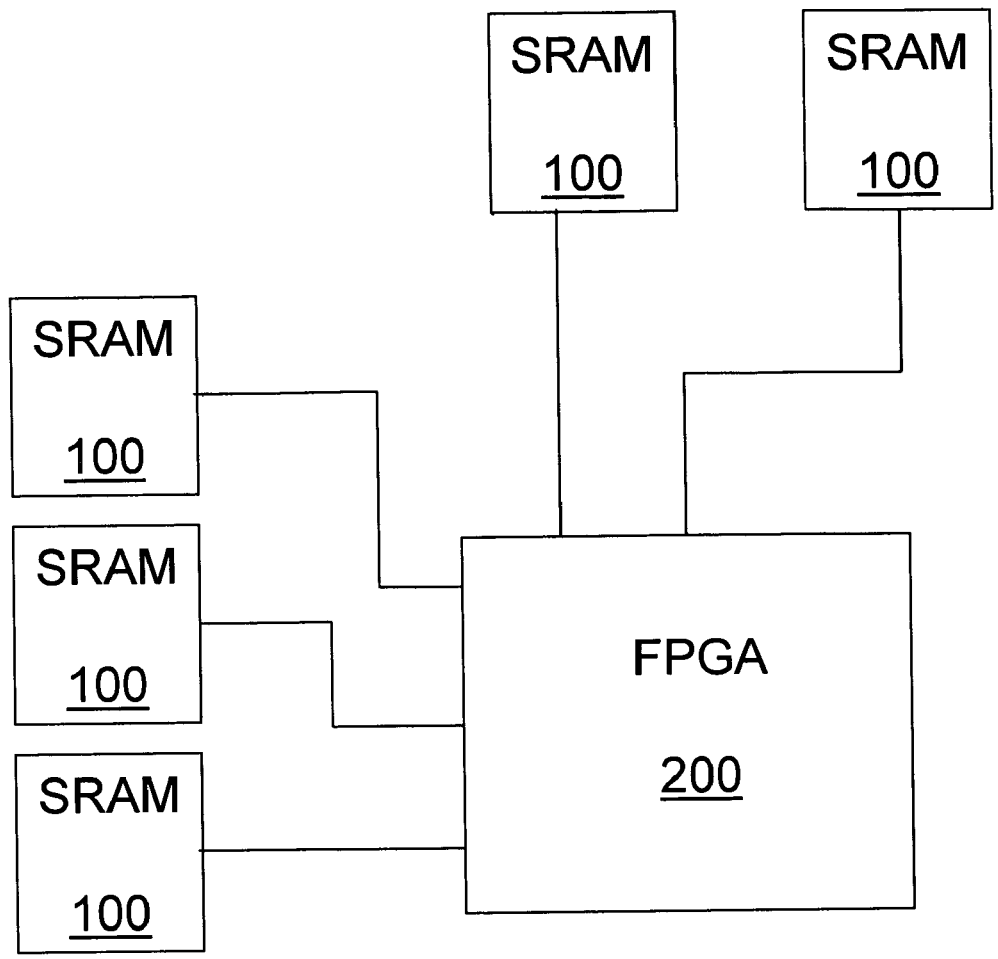
FIG. 1 is a schematic view of an environment in which an illustrative embodiment of the present invention may be used.

In an illustrative embodiment, the present invention is used with a Static Random Access Memory (SRAM) 100 and a Field Programmable Gate Array (FPGA) 200. FIG. 1 illustrates an example implementation using multiple SRAMs 100 with a single FPGA 200. In the illustrative embodiment, each SRAM 100 is a 36-bit device. An extra bit is used as a designator bit with each 8-bit word, as described in further detail below. While the illustrative embodiment is provided as an example of an implementation of an embodiment of the invention, it will be apparent that the present invention may be used with a wide variety of electronic systems and circuits. By way of non-limiting examples, RAM and/or Application Specific Integrated Circuit (ASIC) dies may be used.

Figure 2:
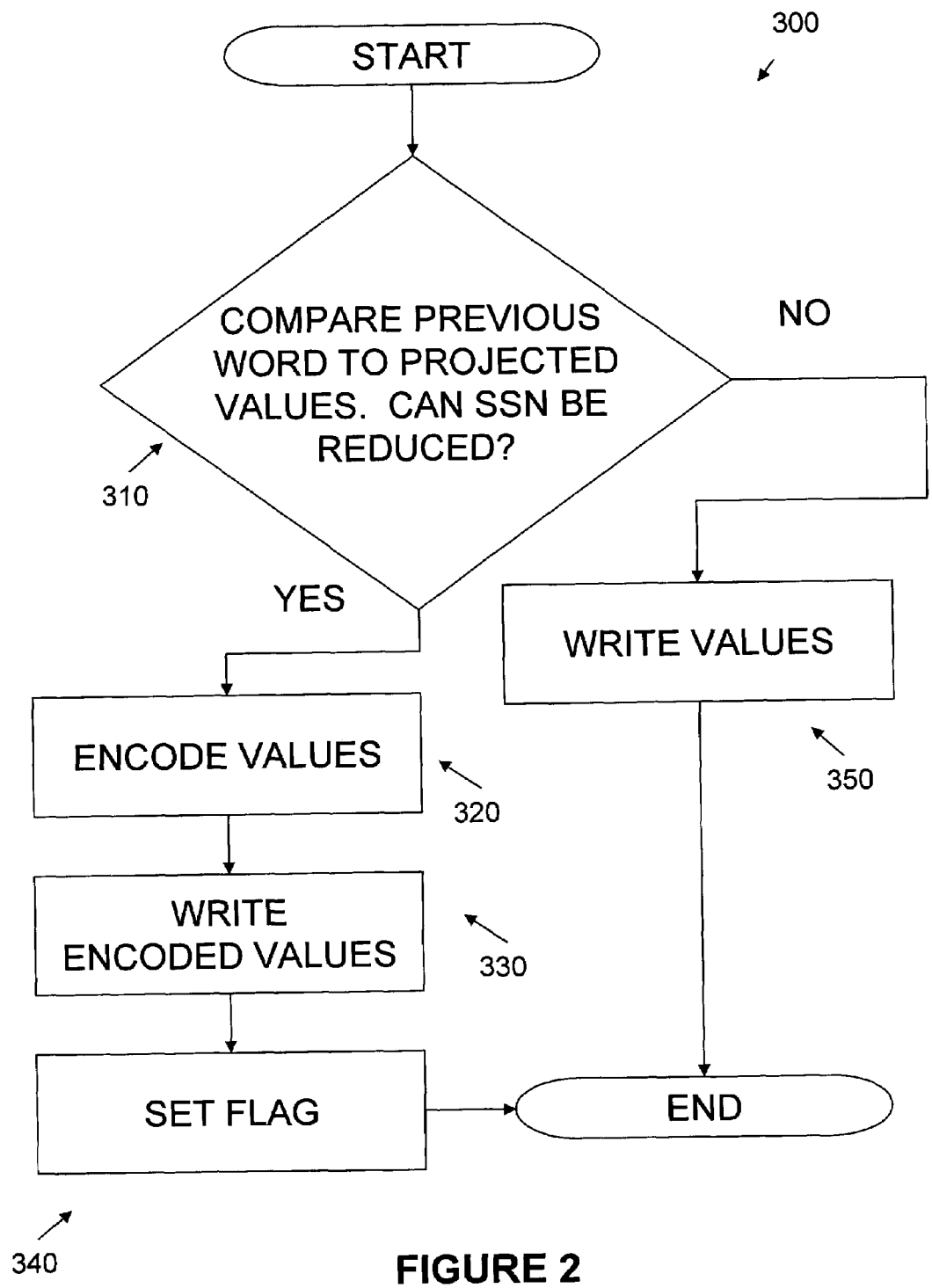
FIG. 2 is a flowchart of a method according to an illustrative embodiment of the invention.

With reference to FIG. 2, the illustrative embodiment of the invention provides a method 300 for use with a scoring process to determine if a switching noise cumulative effect for the word being evaluated can be reduced by encoding the bits in the word before they are written. This method 300 compares 310 the previous word actually written to the SRAM 100, 8-bits in this example, and the projected values that are anticipated to be written to the corresponding word bits, 8-bits in this example, of SRAM 100. In the illustrative embodiment, the comparison 310 may be performed by a scoring process, described in greater detail below.

With further reference to FIG. 2, if the comparison 310 determines that the switching noise cumulative effect can be reduced by a change in the bits to be written, such as by reducing a cumulative number of logic value changes for each bit, the projected values are encoded 320 before being written 330 to SRAM 100, and the designator bit is set 340. If the comparison 310 determines that the switching noise cumulative effect can not be reduced by altering the bits to be written, then the projected values are written 350 to SRAM 100 unchanged, and the designator bit is not set. Likewise, when the SRAM 100 is read, the designator bit of each word is read to determine if the corresponding 8-bit word needs to be decoded. The method 300 is performed for each word in each of the SRAMs 100. Optionally, multiple designator bits may be used and any number of word bits may be used in connection with each designator bit or bits.

The comparison 310 may be performed by a wide variety of techniques, such as, for example, communications system theories, statistical or other mathematical operations, to seek to minimize the transient energy caused by changes in the logic values during transitions. In the illustrative embodiment, a scoring process may be used. With reference to Table 1, scores are established for each type of logic transition between the previous bit value written (regardless of whether it was previously encoded) and the projected bit value. The scores are intended to approximate the switching noise effect of each of the bit transitions, if the transition were to occur from the value previously written to the projected value, by providing a representation of transient voltage effects caused by each logic transition type. As indicated in Table 1, the direction of the transient voltage effect is also represented by the score, as the 0 to 1 transition has a +1 score, while the 1 to 0 transition has a −1 score.

TABLE 1

| Previous Bit Value Written | Projected Bit Value | Score |
|---|---|---|
| 0 | 0 | 0 |
| 1 | 1 | 0 |
| 0 | 1 | +1 |
| 1 | 0 | −1 |

In the example of the 8-bit word, the most extreme scores possible are +8 and −8, which would represent all the bits transitioning one way or the other. A score of 0 represents no net transitions, where 0 to 1 transitions are balanced by 1 to 0 transitions. In the illustrative embodiment, if the total score for the bits is >+3 or <−3, then the designator bit will be written, indicating an encoded transition and encoded bits will be written to the SRAM 100 for that word. If the total score is <+4 and >−4, then the designator bit will not be written and the bits written to the SRAM 100 for that word will not be encoded.

The goal of the scoring process in the illustrative embodiment is to reduce the transition energy when there are many bits changing in one direction by making transition bits static and static bits have transitions. In one implementation, the encoding process can be automatic, with the use of the designator bit to override encoding and permit un-encoded bits to be written.

In the present illustrative embodiment, the designator bit may simply be 1 to indicate encoded word bits or 0 to indicate non-encoded word bits. Alternatively, the designator bit may also be used to minimize transition energy during encoding. By way of example, Table 2 illustrates how the designator bit may be used to avoid a transition in the designator bit for encoded transitions.

TABLE 2

| Previous Designator Bit Value to/from SRAM | Current Designator Bit to/from SRAM | Action |
|---|---|---|
| 0 | 1 | Do not encode/decode. Non-encoded transition. |
| 1 | 0 | Do not encode/decode. Non-encoded transition. |
| 0 | 0 | Encode/decode. Encoded transition. |
| 1 | 1 | Encode/decode. Encoded transition. |

According to the illustrative embodiment, the word bits, and optionally the designator bit, may be very localized to be located close together in a pinout and on the FPGA die. In such a configuration, the present invention may provide a greater benefit, as the cumulative offsetting physical effect of each of the bits located close together can be more effective by the use of close spacing. Accordingly, the cumulative scoring process can more closely represent the offsetting physical effect.

Figure 3:
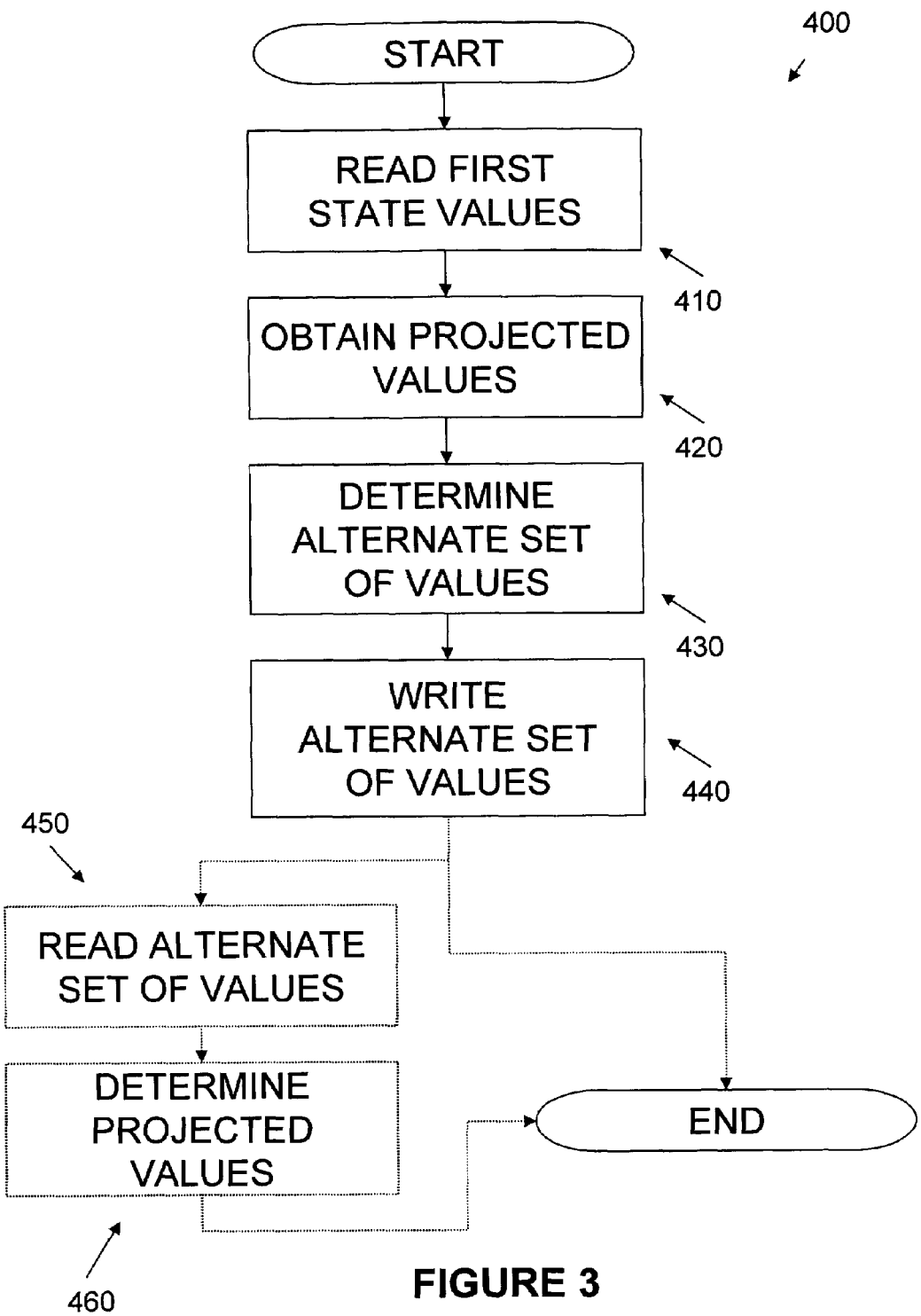
FIG. 3 is a flowchart of a method according to another illustrative embodiment of the invention.

In another illustrative embodiment of the invention a scoring process is not used to determine if encoding is required, as each transition is encoded to seek to reduce the switching noise cumulative effect. In this embodiment, as illustrated by way of example in FIG. 3, a method 400 includes reading 410 values of a first state of a first set of bits of a first word and obtaining 420 a first projected value of a second state of each of the first set of bits. A first alternate set of values is determined 430, wherein the first alternate set of values have at least one value differing from the first projected values of the second state to reduce a first switching noise cumulative effect. The method also includes writing 440 the first alternate set of values to the first set of bits as the second state. This method can also optionally include reading 450 the first alternate set of values from the first set of bits and determining 460 the projected value of a second state of each of the first set of bits from the first alternate set of values. This embodiment may be used in combination with aspects of the other embodiments, aspects or alternatives described herein.

Various embodiments of the invention may also include looking ahead to more than just the next state. For example, in determining the desired values to be written to the bits as the second state, any encoding process may also consider projected values corresponding to one or more future states beyond the second state in seeking to reduce the switching noise cumulative effect of any or all of the transitions corresponding to the state changes.

Various embodiments of the invention can be used in a wide variety of applications. Examples include, but are not limited to stored medium date, real-time data, or combinations thereof. While not limited to cases involving sequentially-addressed memory, applications of various embodiments of the invention involving non-sequential changes in memory addressing may benefit from a wide variety of memory management techniques. By way of example, the techniques may aid in correlating the value presently existing at a memory location with one or more projected values for that memory location, providing a better representation of the transition by knowing the value presently existing at that location for comparison with the projected value. Examples in which this situation may arise include use of a stored medium while also receiving real-time commands, requiring a non-sequential change in memory addressing.

A non-limiting illustrative example of a memory management technique for use in conjunction with various embodiments of the invention includes the use of an internal look-up table. In this example, the look-up table is used to store the first word of a segment of words, along with the memory location that corresponds to the first word of the segment. The stored word in the look-up table may be encoded or non-encoded. At the memory location corresponding to the first word of the segment is a benign word, such as, for example, 10101010. The memory locations of the remaining words in the segment contain the words, in encoded or non-encoded form, of the remainder of the segment. Therefore, any new segment written to that location minimizes the switching noise cumulative effect, as a benign word is written to bits containing the same benign word (or another word, the switching noise cumulative effect potentially reduced by the 10101010 values), while the remaining projected values of the words of the segment are known and any encoding may optionally be used to minimize the switching noise cumulative effect relative to the words after the first word.

Embodiments of the present invention may be used as a bus protocol standard by the use of appropriate encoding and corresponding decoding techniques to seek to minimize SSN among conductors on the bus. Examples of use of the present invention can include, but are not limited to, FPGAs and ASICs. Embodiments of the present invention may also be used in connection with automatic test equipment. It is understood that various embodiments of the invention may be implemented on a wide variety of electronic devices, particularly those using logic switching circuitry, and that the various methods can be implemented in hardware or software or a combination thereof.

The illustrative embodiment, implementations and examples herein are meant to be illustrative and not limiting. The present invention has been described by way of example, and modifications and variations of the exemplary embodiments will suggest themselves to skilled artisans in this field without departing from the spirit of the invention. Features and characteristics of the above-described embodiments may be used in combination. The preferred embodiments are merely illustrative and should not be considered restrictive in any way. The scope of the invention is to be measured by the appended claims, rather than the preceding description, and all variations and equivalents that fall within the range of the claims are intended to be embraced therein.

What is claimed is:

1. A method for reducing simultaneous switching noise, comprising:
   reading values of a first state of a first set of bits of a first word;
   projecting value of a corresponding second state of each of the first set of bits;
   determining a score representative of at least a plurality of binary transitions, each binary transition from the first state to the corresponding second state;
   if the score indicates that more than half of the first states of the plurality of binary transitions differ from the corresponding second states, invert the values of the second states and set a designator;
   if the score does not indicate that more than half of the first states of the plurality of binary transitions differ from the corresponding second states, reset the designator;
   write the second states to a plurality of bits corresponding to the plurality of binary transitions; and
   if the designator is set, write the designator to a bit associated with the plurality of bits corresponding to the plurality of binary transitions.

2. The method of claim 1, further comprising:
   reading the second state of each of the plurality of binary transitions;
   reading the designator corresponding to the plurality of binary transitions;
   inverting the values of the second state, if the designator indicates that the values of the second state were previously inverted.

3. The method of claim 1, wherein setting the designator comprises matching the designator to the previous designator value and resetting the designator comprises matching the designator to the inverted previous designator value.

4. A device to reduce transient noise in a digital circuit system, comprising:
   means for determining a score representative of at least a plurality of binary transitions, each binary transition from a first state to a corresponding second state;
   means for inverting the values of the second states if the score indicates that the absolute value of a difference between the number of high to low binary transitions and the number of low to high binary transition in the plurality of binary transitions is greater than the absolute value of a difference between the number of high to high binary transitions and the number of low to low binary transitions;

means for setting a designator if the score indicates the absolute value of the difference between the number of high to low binary transitions and the number of low to high binary transitions in the plurality of binary transitions is greater than the absolute value of the difference between the number of high to high binary transitions and the number of low to low binary transitions; and means for resetting the designator if the score indicates the absolute value of the difference between the number of high to low binary transitions and the number of low to high binary transitions in the plurality of binary transitions is not greater than the absolute value of the difference between the number of high to high binary transitions and the number of low to low bin transitions.

5. The device of claim 4, further comprising:

means for reading the second state of each of the plurality of binary transitions;

means for reading the designator corresponding to the plurality of binary transitions;

means for inverting the values of the second state, if the designator indicates that the values of the second state were previously inverted.

6. The method of claim 4, wherein setting the designator comprises matching the designator to the previous designator value and resetting the designator comprises matching the designator to the inverted previous designator value.

* * * * *

UNITED STATES PATENT AND TRADEMARK OFFICE
CERTIFICATE OF CORRECTION

PATENT NO. : 7,523,238 B2
APPLICATION NO. : 11/170857
DATED : April 21, 2009
INVENTOR(S) : Messier It is certified that error appears in the above-identified patent and that said Letters Patent is hereby corrected as shown below:

Claim 1, column 6, line 28 currently reads as follows:

"projecting value of a corresponding second state of each of"

Please correct Claim 1, column 6, line 28 to read as follows:

-- projecting values of a corresponding second state of each of --

Claim 4, column 6, line 66 currently reads as follows:

"the number of low to high binary transition in the plu-"

Please correct Claim 4, column 6, line 66 to read as follows:

-- the number of low to high binary transitions in the plu- --

Claim 4, column 8, line 2 currently reads as follows:

"tions and the number of low to low bin transitions"

Please correct Claim 4, column 8, line 2 to read as follows:

-- tions and the number of low to low binary transitions --

Signed and Sealed this

Sixteenth Day of June, 2009

JOHN DOLL
*Acting Director of the United States Patent and Trademark Office*